(12) United States Patent
Nonaka

(10) Patent No.: US 9,905,312 B2
(45) Date of Patent: Feb. 27, 2018

(54) SHIFT REGISTER CIRCUIT, GATE DRIVER AND DISPLAY APPARATUS

(71) Applicant: NLT Technologies, Ltd., Kanagawa (JP)

(72) Inventor: Yoshihiro Nonaka, Kanagawa (JP)

(73) Assignee: NLT TECHNOLOGIES, LTD., Kanagawa (JP)

( * ) Notice: Subject to any disclaimer, the term of this patent is extended or adjusted under 35 U.S.C. 154(b) by 184 days.

(21) Appl. No.: 14/954,160

(22) Filed: Nov. 30, 2015

(65) Prior Publication Data

US 2016/0163401 A1    Jun. 9, 2016

(30) Foreign Application Priority Data

Dec. 3, 2014  (JP) ................................. 2014-244762
Aug. 6, 2015  (JP) ................................. 2015-156162

(51) Int. Cl.
*G11C 19/00*    (2006.01)
*G11C 19/28*    (2006.01)
(Continued)

(52) U.S. Cl.
CPC ........... *G11C 19/28* (2013.01); *G09G 3/3266* (2013.01); *G09G 3/3677* (2013.01);
(Continued)

(58) Field of Classification Search
None
See application file for complete search history.

(56) References Cited

U.S. PATENT DOCUMENTS

2006/0071890 A1    4/2006  Kikuchi
2007/0274432 A1*  11/2007  Yu .......................... G11C 19/28
377/64

(Continued)

FOREIGN PATENT DOCUMENTS

JP    2006-106394    4/2006
JP    2008-299941    12/2008
(Continued)

OTHER PUBLICATIONS

Eunji Song and Hyoungsik Nam, "Programmable Pulse Width LTPS TFT Shift Register for High Resolution and High Frame Rate Active Matrix Flat Panel Displays", SID 2013 Digest p. 473-476.

*Primary Examiner* — Tuan T Lam
(74) *Attorney, Agent, or Firm* — Young & Thompson

(57) ABSTRACT

Provided is a shift register circuit including a single conductive transistor which performs overlap scanning without increasing the number of clock signals and reduces power consumption by avoiding an ineffective through current, a gate driver, and a display apparatus. The shift register circuit includes: a shift register unit having a first output transistor which connects an output terminal and a first power supply; and a first gate control circuit of which an output terminal is connected to a gate terminal of the first output transistor, wherein the first gate control circuit includes a timing generation unit and a buffer unit, the buffer unit is a bootstrap circuit, and an output of the timing generation unit to which an input signal is inputted is used as an input of the buffer unit and an output of the buffer unit is used as an output of the first gate control circuit.

14 Claims, 18 Drawing Sheets

(51) Int. Cl.
*G09G 3/3266* (2016.01)
*G09G 3/36* (2006.01)

(52) U.S. Cl.
CPC ............ *G09G 2310/0286* (2013.01); *G09G 2310/0291* (2013.01); *G09G 2310/08* (2013.01); *G09G 2320/0209* (2013.01)

(56) References Cited

U.S. PATENT DOCUMENTS

| | | | |
|---|---|---|---|
| 2008/0219401 A1* | 9/2008 | Tobita | G09G 3/3677 377/79 |
| 2010/0289535 A1* | 11/2010 | Chen | G09G 3/3677 327/109 |
| 2016/0217757 A1* | 7/2016 | Tanaka | G02F 1/13454 |
| 2016/0329015 A1* | 11/2016 | Ji | G09G 3/32 |
| 2016/0372069 A1* | 12/2016 | Lv | G09G 3/36 |

FOREIGN PATENT DOCUMENTS

| | | |
|---|---|---|
| JP | 2009-181612 | 8/2009 |
| WO | WO 2012/073467 | 6/2012 |

* cited by examiner

F I G. 3
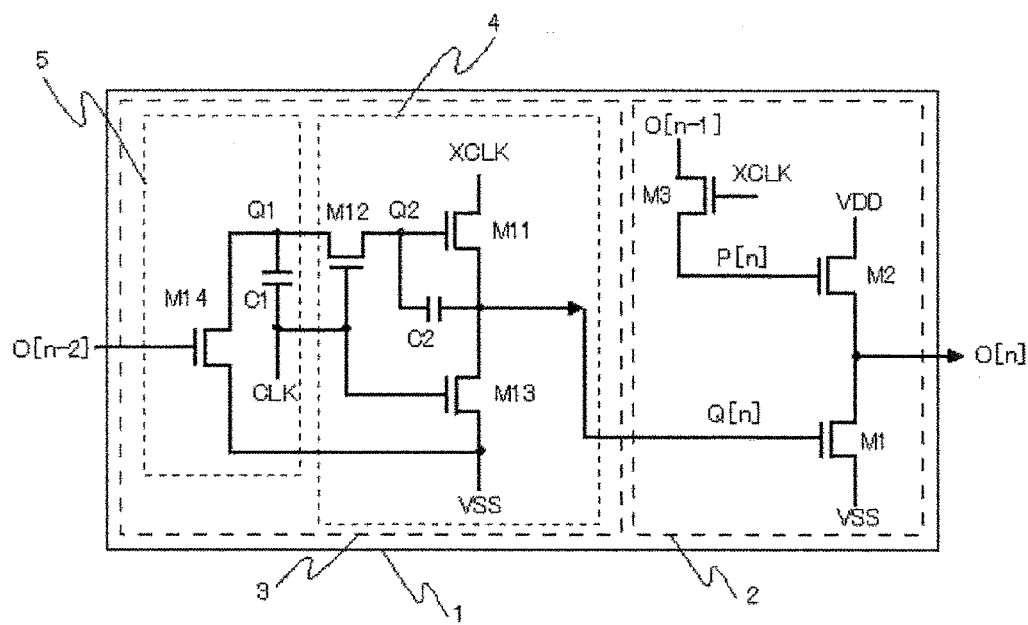

F I G. 6
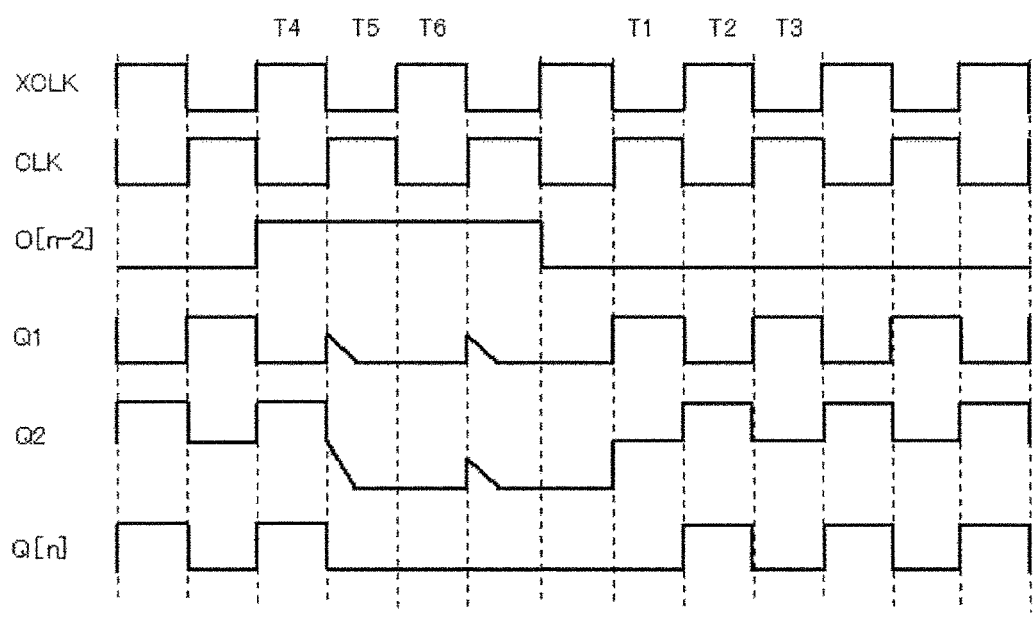

F I G. 7
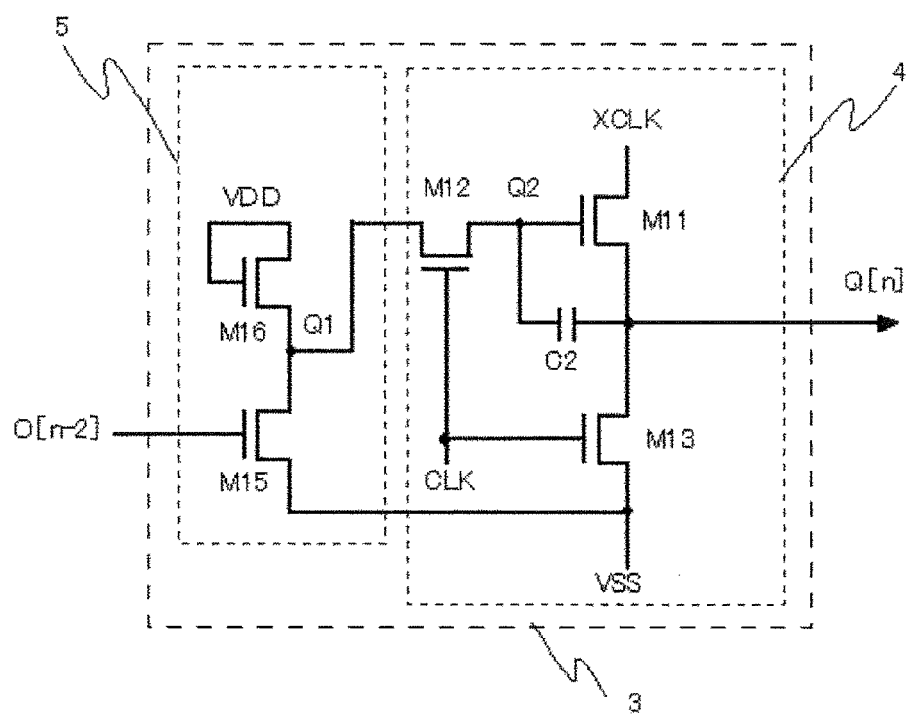

F I G. 8
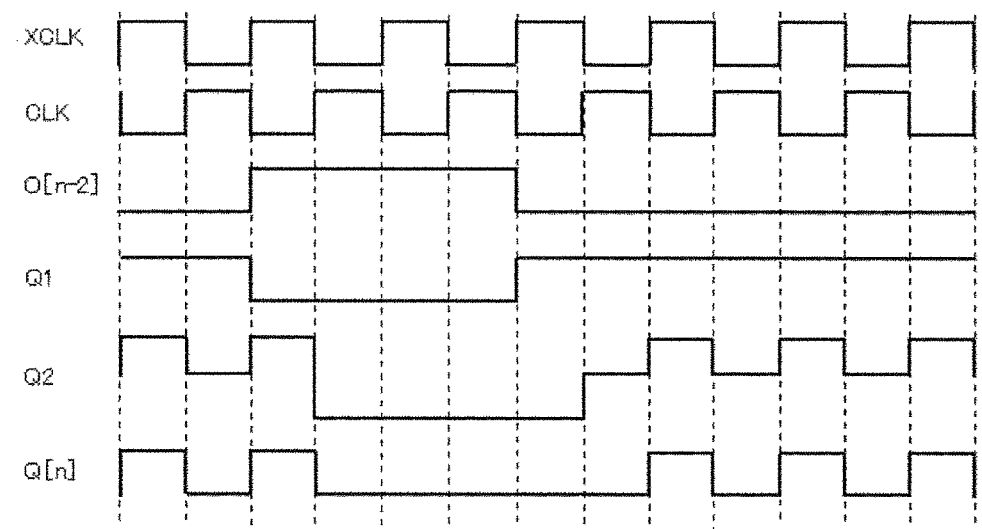

F I G. 9
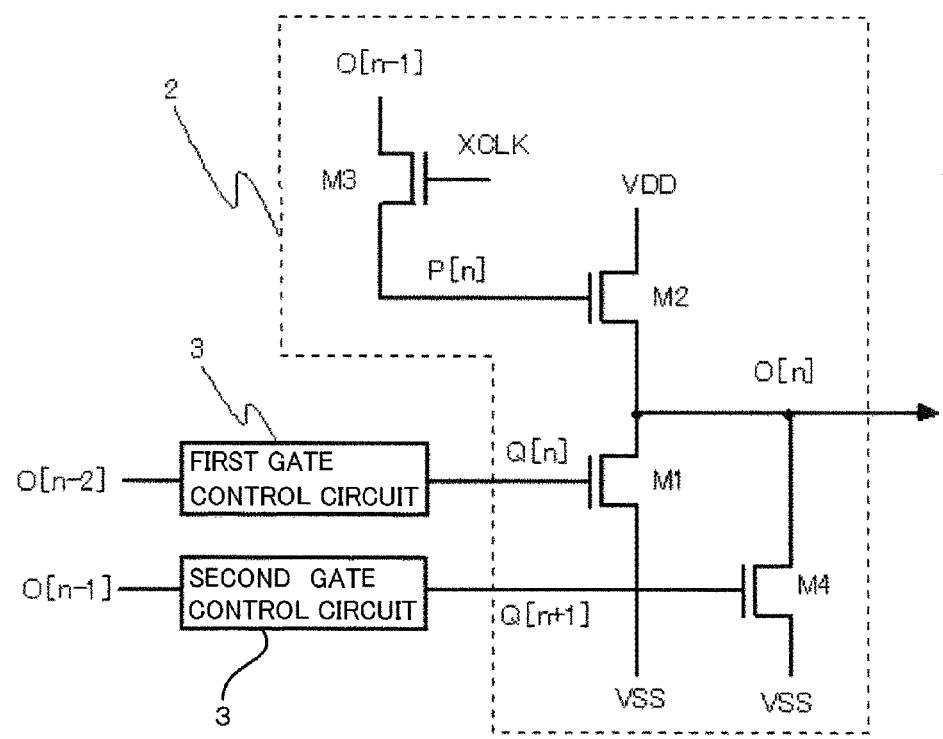

F I G. 1 2
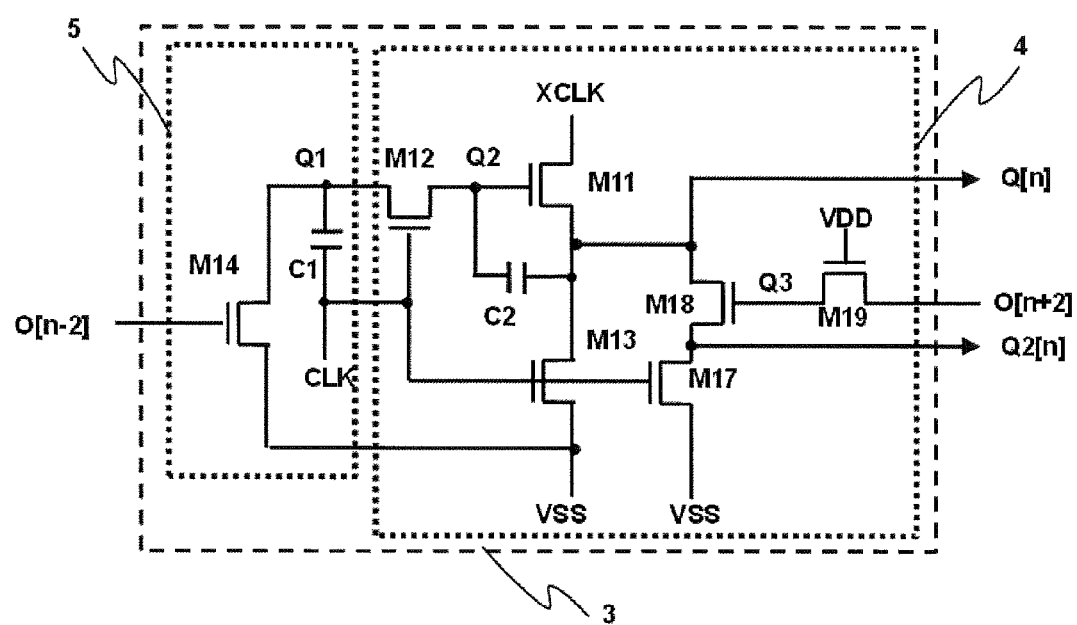

F I G. 1 4
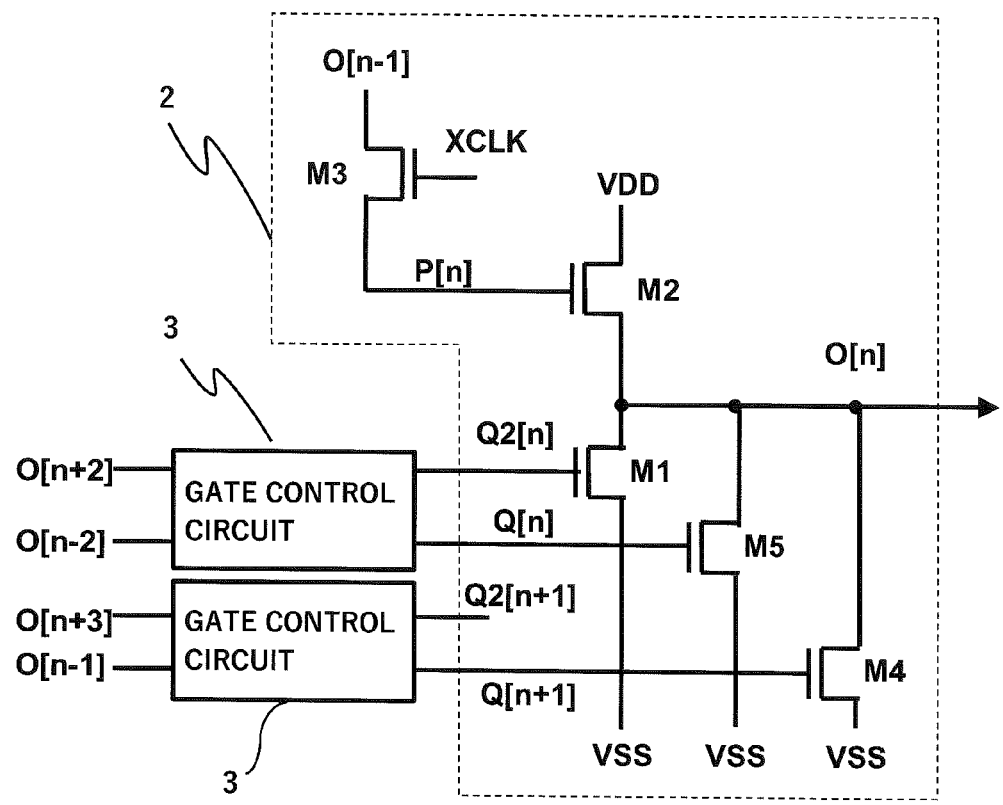

F I G. 1 6
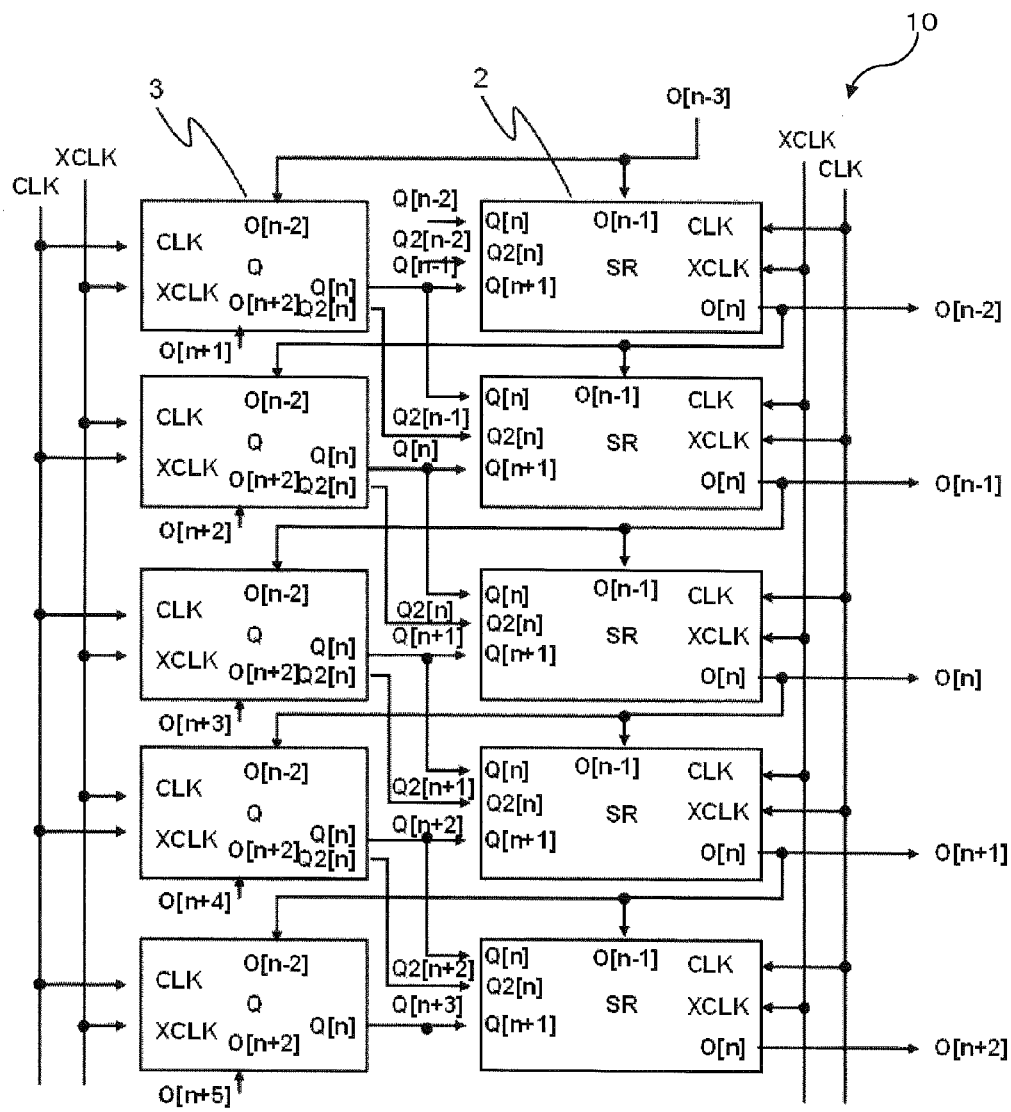

F I G. 1 8
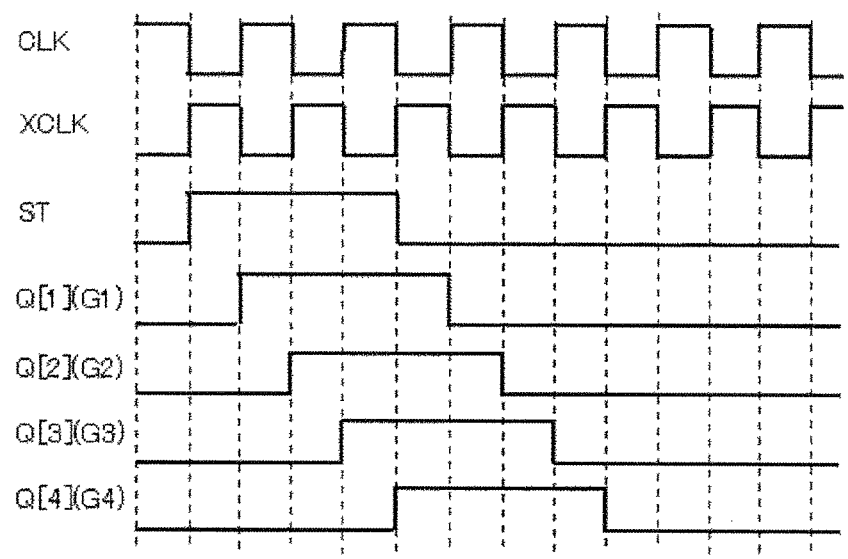

SHIFT REGISTER CIRCUIT, GATE DRIVER AND DISPLAY APPARATUS

CROSS-REFERENCE TO RELATED APPLICATION

This non-provisional application claims priority under 35 U.S.C. § 119(a) on Patent Application No. 2014-244762 filed in Japan on Dec. 3, 2014 and Patent Application No. 2015-156162 filed in Japan on Aug. 6, 2015, the entire contents of which are hereby incorporated by reference.

FIELD

The present invention relates to a shift register circuit, a gate driver including the shift register circuit, and a display apparatus mounted with the gate driver.

BACKGROUND

An active matrix type semiconductor device in which transistors as a switch element are arranged in a matrix shape may achieve a highly reliable device with a small size and low power, and therefore has been widely used. For example, a display apparatus using a liquid crystal or an electroluminescence (EL) material or a sensor device including a light receiving element such as a photodiode has been widely used as an input/output interface for a personal digital assistant, or the like, due to characteristics such as thinness and lightweight. In recent years, an active matrix type apparatus, in which the switch elements for driving display pixels or thin film transistors (TFTs) as an element for amplifying weak sensing signals are arranged on an array substrate which is an insulation substrate, and peripheral circuits for driving the TFTs arranged in an array, for example, scanning line driving circuits or signal line driving circuits include the TFTs formed on the same substrate as the switch elements, has been actively developed. Due to the above-described characteristics, the peripheral circuits may be integrated on the array substrate to extend an effective area of a display or sensing part active matrix, and reduce costs required for the peripheral circuits.

The TFTs arranged in the array as described above are N-type or P-type single conductive transistors in many cases. When the peripheral circuits include only the same single conductive transistors, processes such as mask exposure and impurity injection in a manufacturing process thereof may be made common with the TFTs arranged in the array, which leads to decrease manufacturing costs. An example in which the scanning line driving circuits (gate drivers) among the peripheral circuits are achieved by a connection of shift registers which include only the single conductive transistors is disclosed in Japanese Patent Laid-Open Publication No. 2006-106394.

In recent years, with the size and definition of a display screen becoming larger and higher, load capacity and load resistance of a gate line are also increased. Meanwhile, since a time to select the gate line, generally, one horizontal period is shortened, a demand for gate line driving capability of the gate driver is increased. While on the other hand, methods for extending a selection period by performing overlap scanning in which the selection period overlaps with a plurality of gate lines, to alleviate the demand for the driving capability are disclosed in Japanese Patent Laid-Open Publication No. 2006-106394 and WO2012/073467. The above-described methods are achieved by independently providing a first gate driver operated by two-phase clock of non-overlap clock signals CLK1 and CLK3 and a second gate driver operated by two-phase clock of non-overlap clock signals CLK2 and CLK4, and assigning overlap sections between the CLK1 and CLK3 and the CLK2 and CLK4. Herein, the gate driver includes only the N-type transistor. However, in the methods disclosed in Japanese Patent Laid-Open Publication No. 2006-106394 and WO 2012/073467, in order to extend the period in which the respective gate lines are selected by overlapping the selection period of the plurality of gate lines, there is a need to increase the number of clock signals.

Further, in the overlapping scanning, delaying a selection start of the gate, that is, a time required to start-up a gate line voltage when the single conductivity is provided as an N-type is alleviated by extending the selection period of the gate. On the other hand, a selection end of the gate, that is, falling of the gate line voltage has no effect to alleviate the delay, and when a falling time is delayed exceeding a switching (data idling) time of a data voltage put into a pixel, a data crosstalk, that is, a problem that a voltage which is mixed-up with a data voltage to be put into a next pixel is put occurs. A gate driver which executes the overlap scanning on a clock signal only by two phases is disclosed in Eunji Song and Hyoungsik Nam, SID2013 Digest, 35.4 (2013) (hereinafter, referred to as a non-Patent Document 1).

SUMMARY

FIG. 1 is a circuit diagram of a shift register circuit of this conventional gate driver, and FIG. 2 is a timing chart illustrating an operation waveform of the shift register circuit. As illustrated in FIG. 1, falling of a gate driver output is performed by an output transistor N10 and an inverter (including transistors N7 and N8) for controlling the same. The inverter illustrated in FIG. 1 has a problem that a through current flows from a power supply VDD to a power supply VSS through the transistors N7 and N8. In particular, in order to perform the falling of the gate driver output at a high speed, it is necessary for all the transistors N10, N7 and N8 to be formed in a large size (transistor channel width) so as to flow a large current therethrough, and the through current leads to an increase in power consumption.

In the gate driver including only the single conductive transistor, when the number of clock signals for performing the overlap scanning is increased, there are problems that power consumption required to drive a clock bus line is increased, the number of terminals is increased, and the number of level shift circuits generating a high amplitude clock signal is increased. Further, there is a problem that the power consumption required to perform the falling of the gate line voltage for ending the selection of the gate line at a high speed is also increased.

A shift register circuit according to a first aspect is a shift register circuit including a single conductivity type transistor, and the shift register circuit includes at least: a shift register unit having a first output transistor M1 which connects an output terminal of the shift register circuit and a first power supply VSS; and a first gate control circuit of which an output terminal is connected to a gate terminal of the first output transistor M1, wherein the first gate control circuit includes a timing generation unit and a buffer unit, the buffer unit is a bootstrap circuit, and an output of the timing generation unit to which an input O[n−2] is inputted is used as an input of the buffer unit and an output of the buffer unit is used as an output of the first gate control circuit.

In a shift register circuit according to a second aspect, the buffer unit of the first gate control circuit is a bootstrap circuit including at least: a second transistor M11 which connects a first clock signal XCLK and an output Q[n]; and a third transistor M12 which connects a gate terminal of the second transistor M11 and an output terminal of the timing generation unit.

In the shift register circuit according to a third aspect, the buffer unit of the first gate control circuit includes at least: the second transistor M11 which connects the output Q[n] of the buffer unit and the first clock signal XCLK; the third transistor M12 which connects an input Q1 of the buffer unit and a gate terminal Q2 of the second transistor M11 and is gate-controlled by a second clock signal CLK; and a fourth transistor M13 which connects the output Q[n] of the buffer unit and the first power supply VSS and is gate-controlled by the second clock signal CLK.

In the shift register circuit according to a fourth aspect, the timing generation unit of the first gate control circuit includes: a fifth transistor M14 which is gate-controlled by an input O[n−2] of the first gate control circuit and connects the first power supply VSS and an input Q1 of the buffer unit; and a first capacitor C1 which connects the input Q1 of the buffer unit and the second clock signal CLK.

In the shift register circuit according to a fifth aspect, the timing generation unit of the first gate control circuit includes: a sixth transistor M15 which is gate-controlled by an input O[n−2] of the first gate control circuit and connects the first power supply VSS and an input Q1 of the buffer unit; and a seventh transistor M16 which connects the input Q1 of the buffer unit and a second power supply VDD and has a gate terminal connected to the second power supply VDD.

In the shift register circuit according to a sixth aspect, the shift register unit includes: an eighth output transistor M2 having a source terminal connected to an output terminal of the shift register circuit and a drain terminal connected to a second power supply VDD; and a ninth transistor M3 having a gate terminal to which a first clock signal XCLK is inputted, a drain terminal connected to an input O[n−1], and a source terminal connected to a gate terminal P[n] of the eighth output transistor M2.

A shift register circuit according to a seventh aspect is a shift register circuit including a single conductivity type transistor, and the shift register circuit includes at least: a shift register unit having a first output transistor M1 which connects an output terminal of the shift register circuit and a first power supply VSS; and a first gate control circuit of which an output terminal is connected to a gate terminal of the first output transistor M1, wherein the shift register unit includes a tenth output transistor M4 which connects an output terminal of the shift register and the first power supply VSS, the shift register circuit further includes a second gate control circuit of which an output terminal is connected to a gate terminal of the tenth output transistor M4, each gate control circuit includes a timing generation unit and a buffer unit, and an output of the timing generation unit to which an input O[n−2] or an input O[n−1] is inputted is used as an input of the buffer unit and an output of the buffer unit is used as an output of the second gate control circuit.

In the shift register circuit according to an eighth aspect, the buffer unit included in the first gate control circuit is a bootstrap circuit configured to output the first clock signal, and the buffer unit included in the second gate control circuit is a bootstrap circuit configured to output the second clock signal.

A gate driver according to a ninth aspect is a gate driver in which a plurality of stages of the shift register circuits according to the seventh aspect are connected, wherein an output O[n−2] of the shift register circuit of an (n−2) (n is an integer of 3 or more)-th stage is used as an input of the shift register unit and a first or second gate control circuit of an (n−1)-th stage, and an output Q[n] of the first or second gate control circuit of the (n−1)-th stage is inputted to the shift register unit of the (n−1)-th stage and the shift register unit of the n-th stage (an output O[n−1] of the shift register circuit of the (n−1)-th stage is used as the input of the shift register unit and the second or first gate control circuit of the n-th stage, and an output Q[n+1] of the second or first gate control circuit of the n-th stage is inputted to the shift register unit of the n-th stage and the shift register unit of the (n+1)-th stage).

In the shift register circuit according to a tenth aspect, the shift register circuit is a shift register circuit of an n-th (n is an integer of 3 or more) stage of a gate driver, and the buffer unit included in the first gate control circuit has at least a second output Q2[n], and includes: an eleventh output transistor M17 which connects the output Q2[n] and the first power supply VSS; a twelfth transistor M18 which connects the output Q2[n] and the output Q[n]; and a thirteenth transistor M19 which connects a gate terminal of the twelfth transistor M18 and an output of a shift register circuit of an (n+2)-th stage, wherein the eleventh output transistor M17 is controlled by the second clock signal CLK, and the thirteenth transistor M19 is a bootstrap circuit controlled by a second power supply VDD, and the bootstrap circuit is added to the buffer unit according to the third aspect.

In the shift register circuit according to an eleventh aspect, a second output Q2[n] of the first gate control circuit according to the tenth aspect is connected to the gate terminal of the first output transistor M1.

A gate driver according to a twelfth aspect is a gate driver in which a plurality of stages of the shift register circuits according to the tenth aspect are connected, wherein an output O[n−2] of the shift register circuit of an (n−2)-th stage is used as an input of the shift register unit and the first gate control circuit of an (n−1)-th stage according to the tenth aspect, an output O[n+2] of the shift register circuit of an (n+2)-th stage is used as an input of the first gate control circuit of the (n−1)-th stage, a first output of the first gate control circuit of the (n−1)-th stage is used as an input of the shift register unit of the (n−1)-th stage and the shift register unit of the n-th stage, and a second output of the first gate control circuit of the (n−1)-th stage is used as an input of the shift register unit of the n-th stage.

A display apparatus according to a thirteenth aspect is a matrix type display apparatus in which the gate driver according to ninth or twelfth aspect is mounted, wherein the gate driver is inputted with a two-phase clock signal, a start signal ST is inputted as an input of a shift register of a first stage of the gate driver, a selection period of a gate line is controlled by a pulse width of the start signal ST, and overlap scanning in which a plurality of gate lines are overlapped and selected is performed.

It is to be understood that both the foregoing general description and the following detailed description are exemplary and explanatory and are not restrictive of the invention.

BRIEF DESCRIPTION OF THE DRAWINGS

FIG. 3 is a circuit diagram of a shift register circuit of Embodiment 1.

FIG. 6 is a timing chart illustrating an operation waveform of the gate control circuit of Embodiment 1.

FIG. 7 is a circuit diagram of a gate control circuit of Embodiment 2.

FIG. 8 is a timing chart illustrating an operation waveform of the gate control circuit of Embodiment 2.

FIG. 9 is a circuit diagram of a shift register circuit of Embodiment 3.

FIG. 12 is a circuit diagram of a gate control circuit of Embodiment 5.

FIG. 14 is a circuit diagram of a shift register circuit of Embodiment 6.

FIG. 16 is a circuit diagram of a gate driver of Embodiment 7.

FIG. 18 is a timing chart illustrating an operation waveform of the gate driver in the matrix type display apparatus of Embodiment 8.

DETAILED DESCRIPTION

Figure 1:
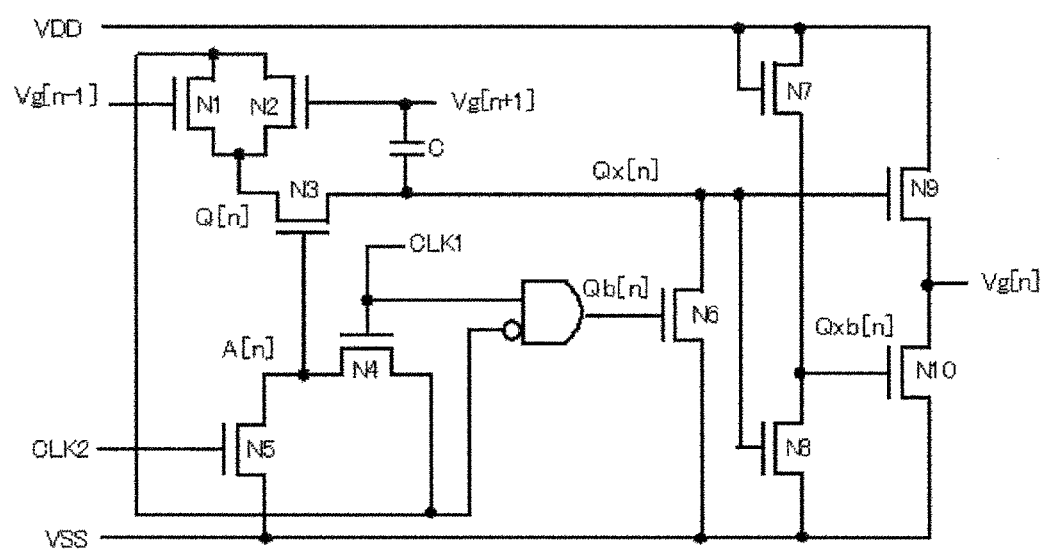
FIG. 1 is a circuit diagram of a conventional shift register circuit.

Hereinafter, embodiments will be described with reference to the accompanying drawings.

Embodiment 1

FIG. 3 is a diagram illustrating a configuration of a shift register circuit of Embodiment 1. As illustrated in FIG. 3, a shift register circuit 1 of the present embodiment is a shift register circuit including a single conductivity type (N-type in the present embodiment) transistor, and includes a shift register unit 2 including an output transistor M1 which connects a first power supply VSS and an output O[n] of the shift register circuit 1, an output transistor M2 which connects a second power supply VDD and the output O[n] of the shift register circuit 1, and a transistor M3 which connects an output P[n] of a bootstrap node at a gate terminal of the output transistor M2 and an output O[n−1] of the shift register circuit of a preceding stage, and a gate control circuit 3 of which an output is connected to a gate terminal of the output transistor M1. The gate control circuit 3 includes a timing generation unit 5 and a buffer unit 4.

Figure 4:
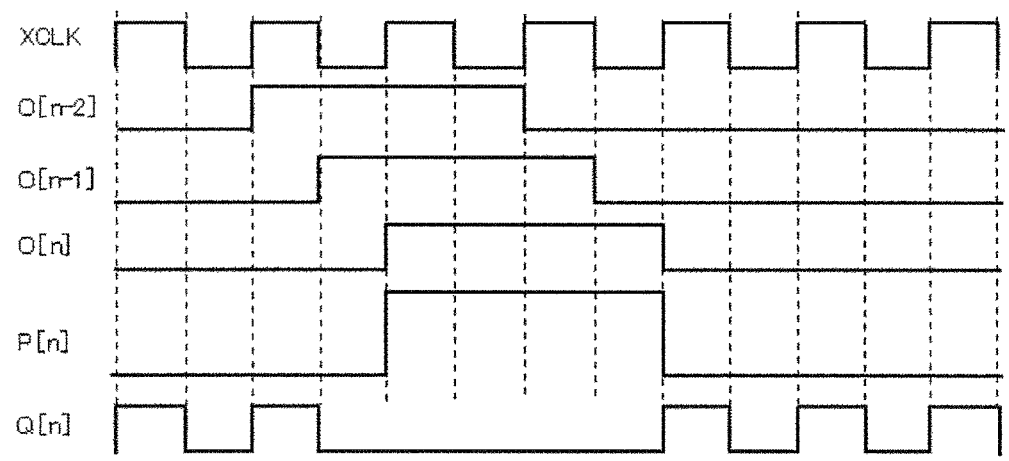
FIG. 4 is a timing chart illustrating an operation waveform of the shift register circuit of Embodiment 1.

An operation waveform for describing an operation of the shift register circuit 1 is illustrated in FIG. 4. If the output O[n−1] of the shift register circuit 1 is at a low level, when a level of a clock signal XCLK is inverted from a low to a high level, the output P[n] of a bootstrap node is fixed to a low level by the transistor M3, and the output transistor M2 is in non-conductive. Meanwhile, when an output Q[n] of the gate control circuit 3 becomes a high level, the output transistor M1 is conducted, and thus the output O[n] of the shift register circuit 1 is fixed to a low level (a first power supply VSS).

After the output O[n−1] of the shift register circuit 1 is inverted to a high level, if the clock signal XCLK is inverted to a high level, the output P[n] of the node rises toward the high level and a voltage between a gate and a source of the output transistor M2 becomes wide, such that the output transistor M2 is in a conduction state. Then, the level of the output O[n] of the shift register circuit 1 rises to a second power supply VDD by supplying a current from the second power supply VDD, and a potential of the output P[n] of the node reaches the second power supply VDD or more by a bootstrap effect. In this case, the output transistor M1 is preferably in a non-conduction state so that a through current from the second power supply VDD to the first power supply VSS does not flow without hindering the rising of the output, and the timing generation unit 5 generates a signal so that the output Q[n] of the gate control circuit 3 is maintained at a low level.

After the output O[n−1] of the shift register circuit 1 is again inverted to a low level, if the clock signal XCLK is inverted to a high level, the output P[n] of the node is fixed to a low level, and thus the output transistor M2 is in non-conductive. Meanwhile, if the output Q[n] of the gate control circuit 3 is again inverted to a high level, the output O[n] of the shift register circuit 1 via the output transistor M1 falls to the first power supply VSS which is at the low level.

Next, the gate control circuit 3 of the present embodiment will be described with reference to FIG. 5.

First, the buffer unit 4 included in the gate control circuit 3 will be described. The buffer unit 4 is a bootstrap circuit including at least a transistor M11 which connects the output Q[n] of the gate control circuit 3 and the clock signal XCLK, a transistor M12 which connects an input terminal Q1 of the buffer unit 4 and a gate terminal Q2 of the transistor M11 and is gate-controlled by a clock signal CLK, and a transistor M13 which connects the output Q[n] of the gate control circuit 3 and the first power supply VSS and is gate-controlled by the clock signal CLK. Herein, the clock signals XCLK and CLK are two phase-clock signals which are opposite to each other. Further, in order to increase the bootstrap effect of the transistor M11, a capacitor C2 may be provided between gate and source terminals of the transistor M11.

Next, the timing generation unit 5 included in the gate control circuit 3 will be described. The timing generation unit 5 includes a transistor M14 which is gate-controlled by an input O[n−2] of the gate control circuit 3 and connects the first power supply VSS and an output Q1 of the timing generation unit 5, and a capacitor C1 which connects the output Q1 of the timing generation unit 5 and the clock signal CLK.

The operation of the gate control circuit 3 illustrated in FIG. 5 will be described below based on an operation waveform illustrated in FIG. 6. When the input of the gate control circuit 3, that is, the output O[n−2] of the shift register circuit of a second preceding stage is at a low level, the output Q1 of the timing generation unit 5 is synchronized with the clock signal CLK at a coupling by the capacitor C1. In a period T1 in which the clock signal CLK and the output Q1 of the timing generation unit 5 are at a high level, the gate Q2 of the transistor M11 via the transistor M12 rises to a potential lower by about a threshold voltage of the transistor M12 than the high level. The potential is maintained by the capacitor C2. Meanwhile, since the clock signal XCLK is at a low level, the output Q[n] of the gate control circuit 3 via the transistor M11 is fixed to a low level. Similarly, the output Q[n] of the gate control circuit 3 is also fixed to a low level by the transistor M13.

Next, when the operation moves to a period T2 in which the clock signal is inverted to change the CLK to a low level and the XCLK to a high level, the transistors M12 and M13 are in the non-conduction state. Meanwhile, the transistor M11 is maintained in the conduction state by a potential difference maintained between the capacitor C2 and a capacitor between the gate and the source of the transistor M11, the potential of the gate Q2 of the transistor M11 rises to a high level or more of the clock signal by the bootstrap effect, and the output Q[n] of the gate control circuit 3 rises to a high level of the clock signal XCLK. Further, when the operation moves to a period T3 in which the clock signal is again inverted, the output Q[n] of the gate control circuit 3 falls to a low level by the transistors M11 and M13. That is, the buffer unit 4 is operated as the bootstrap circuit configured to output the clock signal XCLK via the transistor M11. This operation is repeated in the period in which the output O[n−2] of the shift register circuit of the second preceding stage is at a low level.

Meanwhile, when the operation enters into a period T4 in which the output O[n−2] of the shift register circuit of the second preceding stage becomes a high level, since the transistor M14 is continuously conducted, the output Q1 of the timing generation unit 5 is fixed to a low level without being synchronized with the clock signal CLK. In a period T5 in which the clock signal CLK becomes a high level, the node Q2 of the buffer unit 4 via the transistor M12 is fixed to a low level. Thereby, the clock signal XCLK which is a drain terminal of the transistor M11 is at a low level, and the output Q[n] of the gate control circuit 3 which is a source terminal is also at a low level, but the Q2 which is the gate terminal is also at a low level, and therefore the transistor M11 is kept in the non-conduction state. In addition, charges are not charged in the capacitor between the gate and the source of the transistor M11 as well as the capacitor between the gate and the drain thereof. Therefore, even when the operation moves to a period T6, the clock signal XCLK is inverted, and rises to a high level, the bootstrap effect does not work and the gate terminal Q2 and the source terminal of the transistor M11 do not follow the clock signal CLK. This operation is continued in the period in which the output O[n−2] of the shift register circuit of the second preceding stage is at a high level, and the output Q[n] of the gate control circuit 3 remains in the low level state. Further, in the period T5 in which the clock signal CLK is inverted to a high level, even though operations of instantly increasing the node Q1 for coupling with the capacitor C1 or discharging a charge charged in the capacitor C2, and reducing the node Q2 to a low level are moderate, if each of the operations is reduced to a low level until moving to the period T6, in the period T6, the bootstrap effect does not work.

Figure 5:
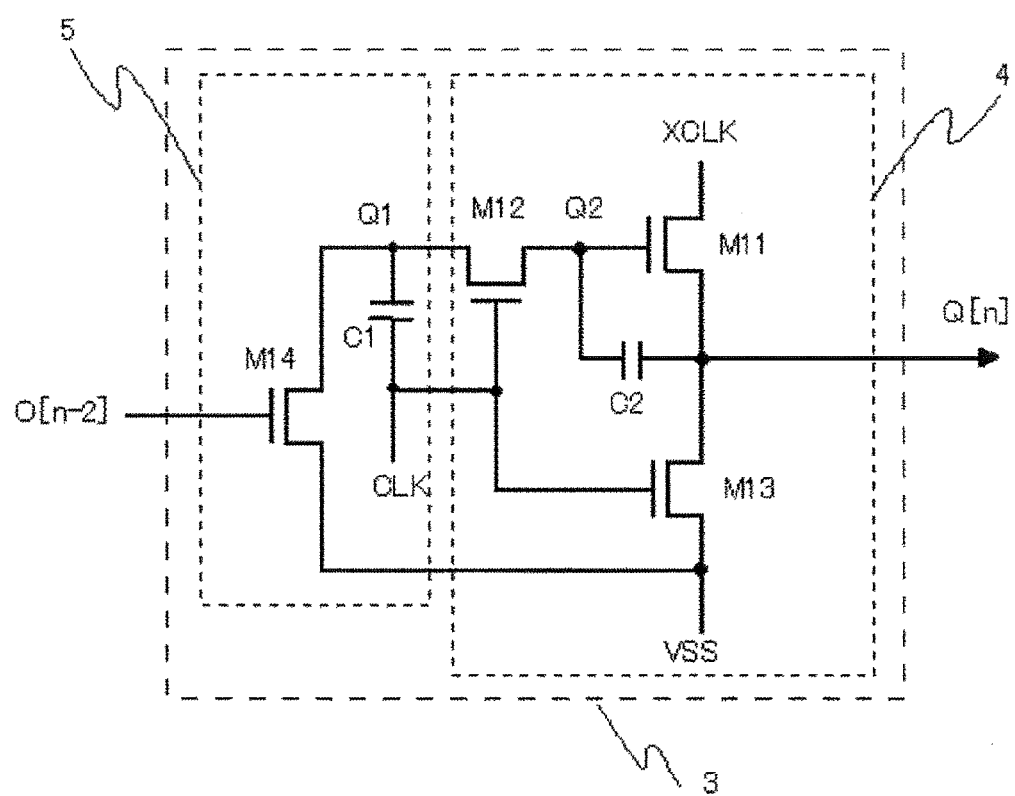
FIG. 5 is a circuit diagram of a gate control circuit of Embodiment 1.

The output Q[n] of the gate control circuit 3 illustrated in FIG. 5 accords with the output Q[n] of the gate control circuit 3 illustrated in FIG. 3, and when the output O[n] of an n-th shift register circuit rises to a high level, it becomes a desired waveform in which the output transistor M1 is in non-conductive so as not to hinder the rising thereof. Further, the waveform is a result generated by the timing generation unit 5 illustrated in FIG. 5, and time shifted.

As described above, since a gate control of the output transistor for decreasing the potential of the gate line at a high speed is performed by a clock driven bootstrap circuit which is the buffer unit, driving of a large load may be executed at a high speed while avoiding power consumption such as the through current. Further, the bootstrap circuit is used as the buffer unit, such that a transistor size or a capacitor size of the timing generation unit 5 included in the gate control circuit 3 may be decreased, and an area of the gate control circuit 3 may be saved. Further, by using a clock signal for driving the bootstrap circuit as an external input signal, a high speed operation may be achieved.

Embodiment 2

Hereinafter, Embodiment 2 will be described with reference to FIG. 7. The present embodiment is different from Embodiment 1 in terms of the configuration of the timing generation unit 5. The timing generation unit 5 includes a transistor M15 which is gate-controlled by the input O[n−2] of the gate control circuit 3 and connects the first power supply VSS and the output Q1 of the timing generation unit 5, and a transistor M16 which connects the output Q1 of the timing generation unit 5 and the second power supply VDD and has a gate terminal connected to the second power supply VDD.

The operation of the gate control circuit 3 illustrated in FIG. 7 will be described below based on an operation waveform illustrated in FIG. 8. When the input of the gate control circuit 3, that is, the output O[n−2] of the shift register circuit of the second preceding stage is at a low level, the output Q1 of the timing generation unit 5 is maintained at a high level lower by a threshold voltage of the transistor M15 than the high level by the transistor M15 diode-connected thereto. Meanwhile, when the output O[n−2] of the shift register circuit of the second preceding stage is at a high level, the output Q1 of the timing generation unit 5 is maintained at a low level. That is, the timing generation unit 5 is operated as an inverter to output an inversion signal of the input O[n−2] of the gate control circuit 3.

When the output Q1 of the timing generation unit 5 is maintained at a high level and the clock signal CLK is maintained at a high level, the gate Q2 of the transistor M11 via the transistor M12 rises to a potential lower by about the threshold voltage of the transistor M12 than the high level. Meanwhile, since the clock signal XCLK is at a low level, the output Q[n] of the gate control circuit 3 via the transistor M11 is fixed to a low level. Similarly, the output Q[n] may be fixed to a low level by the transistor M13. Next, if the clock signal is inverted to change the CLK to a low level and the XCLK to a high level, respectively, the transistors M12 and M13 are in the non-conduction state. Meanwhile, the transistor M11 maintains the conduction state, the potential of the gate Q2 of the transistor M11 rises to a high level or more of the clock signal by the bootstrap effect, and the output Q[n] of the gate control circuit 3 rises to a high level of the clock signal XCLK. Further, if the clock signal is again inverted, the output Q[n] of the gate control circuit 3 falls to a low level by the transistors M11 and M13. This operation is repeated in the period in which the output O[n−2] of the shift register circuit 1 of the second preceding stage is at a low level.

Meanwhile, if the output Q1 of the timing generation unit 5 is maintained at a low level, when the clock signal CLK is at a high level, the node Q2 of the buffer unit 4 via the transistor M12 is fixed to a low level. Thereby, the clock signal XCLK which is a drain terminal of the transistor M11 is at a low level, and the output Q[n] of the gate control circuit 3 which is a source terminal is also at a low level, but the Q2 which is the gate terminal is also at a low level, and therefore the transistor M11 is kept in the non-conduction state. Further, charges are not charged in the capacitor between the gate and the source of the transistor M11 as well as the capacitor between the gate and the drain thereof. Therefore, even when the clock signal XCLK is inverted and rises to a high level, the bootstrap effect does not work, and the gate terminal Q2 and the source terminal of the transistor M11 do not follow. This operation is continued in the period in which the output O[n−2] of the shift register circuit 1 of the second preceding stage is at a high level, and the output Q[n] of the gate control circuit 3 remains in the low level state.

Characteristics of the present embodiment are that the gate control circuit 3 which controls the gate of the output transistor of the shift register circuit 1 is provided with the clock driven bootstrap circuit as the buffer unit 4. Thereby, the gate control circuit 3 may output the clock signal via the transistor M11 without reducing amplitude, as well as without delay.

Among the publicly known examples described in the related art, an example in which the gate control circuit 3 includes only the above-described timing generation unit 5 is disclosed. That is, an example, in which the timing generation unit 5 including the capacitor and the transistor illustrated in FIG. 5, or the timing generation unit 5 using the inverter illustrated in FIG. 7 is directly connected to the gate of the output transistor of the shift register circuit, is disclosed in Japanese Patent Application Laid-Open No. 2009-181612 or the Non-Patent document 1. Driving the output transistor M1 of the shift register circuit 1, in particular, conducting the same charges a gate capacity load Cg thereof, and makes the gate potential to a high potential, such that the gate capacity load Cg needs to be charged at a high speed and at high potential for a high speed operation.

When directly driving the output transistor M1 of the shift register circuit 1 by the timing generation unit 5 including the capacitor C1 and the transistor M14 disclosed in Japanese Patent Application Laid-Open No. 2009-181612, the potential of the gate charging voltage may be deteriorated. That is, the gate charging potential is determined by a dividing voltage ratio of the capacitor C1 of the timing generation unit 5 and a gate capacitor Cg of the output transistor M1, and therefore, a relation of C1>Cg is required to obtain a high voltage. In order to obtain the capacitor C1, a layout area which is more than the output transistor M1 is required.

Further, when using the timing generation unit 5 including the inverter (the transistors M15 and M16 of FIG. 7) disclosed in the Non-Patent Document 1, there is a problem entailed in power consumption. That is, in order to charge the gate capacity load Cg at a high speed, it is necessary for the transistor M16 to be formed in a large size so as to flow a large current therethrough. Meanwhile, at the time of conducting the transistor M15, the through current flows between the second power supply VDD and the first power supply VSS via the transistors M16 and M15. Further, in order to make the gate potential of the output transistor M1 at a low level, it is necessary for the transistors M16 and M15 to have a size relationship of M15>M16 therebetween. Thereby, it is not possible to avoid the flow of the large through current via the transistors M15 and M16 which are have a large size.

Figure 2:
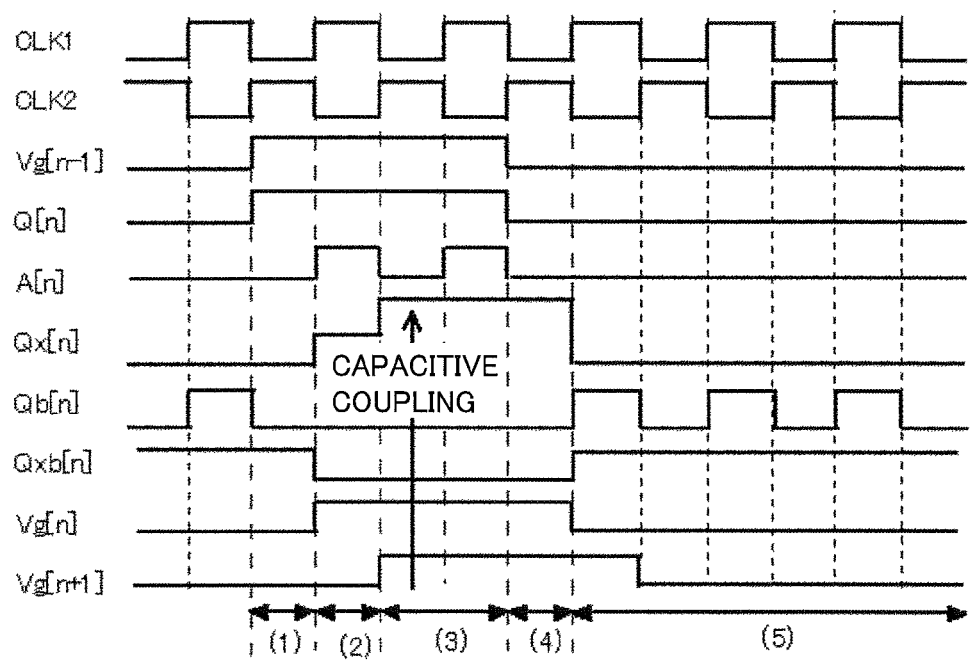
FIG. 2 is a timing chart illustrating an operation waveform of the conventional shift register circuit.

Similarly, an example in which the buffer unit 4 is provided as the inverter is illustrated in FIG. 2 of Japanese Patent Application Laid-Open No. 2008-299941. That is, this patent discloses an example in which the inverter including transistors T13 and T14 is provided as the buffer unit 4, and a circuit including transistors T11b and T12b is provided as the timing generation unit 5. Herein, there is a problem that, in order to charge the gate capacity load of the transistor T16 at a high speed by the inverter connecting the gate terminal of the transistor T16 with the output B point, it is necessary for the inverter to flow a large through current therethrough similar to the Non-Patent Document 1.

As the publicly known example, when directly driving the gate of the output transistor M1 of the shift register circuit 1 by the output of the timing generation unit 5, there is a problem in a timing margin during the high speed operation in addition to the above-described problems. That is, the inversion of the input signal of the timing generation unit 5 directly leads to the inversion of the gate potential of the output transistor of the shift register circuit 1. Thereby, an operation delay is not allowed in the timing generation unit 5.

Meanwhile, in the case of the present embodiment, the inversion of the gate potential of the output transistor is performed by the buffer unit 4 of the clock driven bootstrap. Since it may be configured that the timing generation unit 5 performs the inversion operation in the period T5 before a half clock period thereof, and completes the inversion before moving to the period T6 in which the buffer unit 4 is operated, an inversion operation margin of the half clock period is allowed at most. As described above, the output rising time of the timing generation unit 5 is not directly reflected to the output falling time of the shift register circuit 1, such that the demand for the high speed operation may be alleviated.

Embodiment 3

Hereinafter, Embodiment 3 will be described with reference to FIG. 9. The present embodiment is a shift register circuit including the single conductivity type transistor, which has a configuration as described below. The shift register circuit includes an output transistor M1 which connects the output O[n] of the shift register circuit 1 and the first power supply VSS, a first gate control circuit 3 which uses the output O[n−2] of the shift register circuit 1 as an input and has an output Q[n] connected to the gate terminal of the output transistor M1, a second output transistor M4 which connects the output O[n] of the shift register circuit 1 and the first power supply VSS, and a second gate control circuit 3 which uses the output O[n−1] of the shift register circuit 1 as the input and has an output Q[n+1] connected to the gate terminal of the output transistor M4. Further, the shift register circuit includes an output transistor M2 which connects the output O[n] of the shift register circuit 1 and the second power supply VDD, and a transistor M3 which connects the gate terminal P[n] thereof and the output O[n−1] of the shift register circuit 1 and is gate-controlled by the clock signal XCLK. Herein, a plurality of stages of the shift register circuits 1 are connected to the outputs O[n−2], O[n−1] and O[n] in this order. The first and second gate control circuits 3 may have the same configuration as the gate control circuit 3 described in Embodiment 1 or 2. The present embodiment is different from Embodiment 1 in that the output transistor M4 and the second gate control circuit 3 for controlling the same are added.

Figure 10:
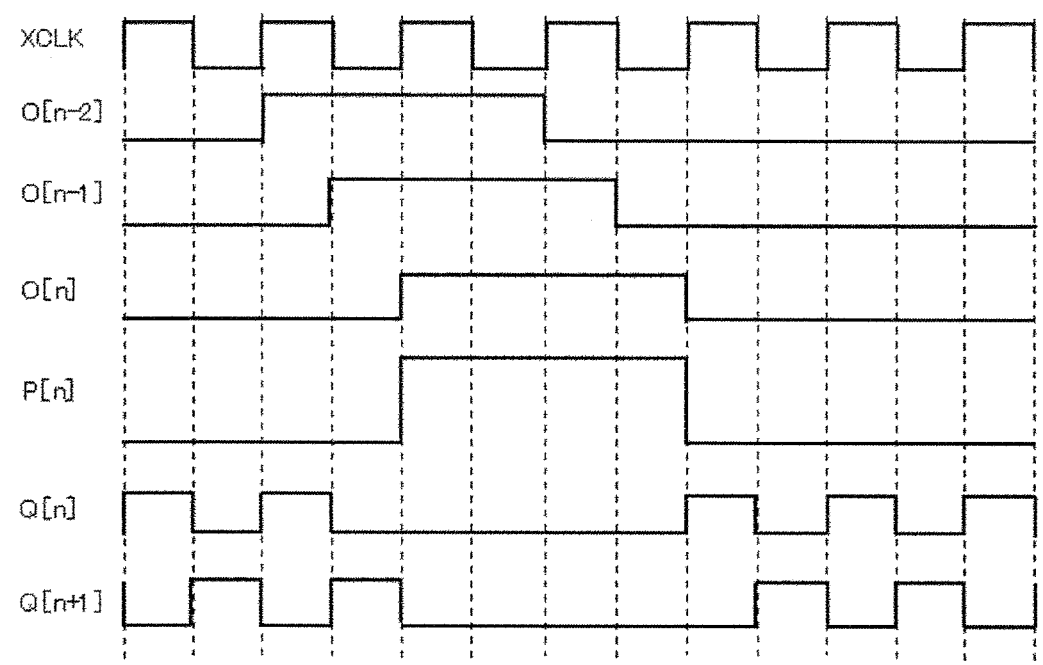
FIG. 10 is a timing chart illustrating an operation waveform of the shift register circuit of Embodiment 3.

An operation of the present embodiment will be described using an operation waveform illustrated in FIG. 10. The output Q[n] of the first gate control circuit 3 and the output Q[n+1] of the second gate control circuit 3 are the clock signal shifted by a half period to each other in synchronization with the clock signal XCLK while each input signal thereof is at a low level. That is, the buffer unit included in the first gate control circuit 3 becomes the bootstrap circuit configured to output the clock signal XCLK and the buffer unit included in the second gate control circuit 3 becomes the bootstrap circuit configured to output the clock signal CLK. Thereby, any one of the output transistors M1 and M4 is in the conduction state, and therefore the output O[n] of the shift register circuit 1 is fixed to a low level. Meanwhile, if the input signal is inverted to a high level, the outputs Q[n] and Q[n+1] of the gate control circuit 3 are fixed to a low level, and therefore the output O[n] of the shift register circuit 1 is not fixed to a low level by the output transistors M1 and M4. The output transistors M2 and M3 of the shift register unit 2 are operated in the meantime to invert the output O[n] of the shift register circuit 1 to a high level. The detailed content thereof is the same as Embodiment 1.

According to the present embodiment, there is provided the shift register for stabilizing the output O[n] of the shift register circuit 1 by the two gate control circuits 3 to be fixed to a low level, other than the period in which the output O[n] of the shift register circuit 1 becomes a high level.

Embodiment 4

Figure 11:
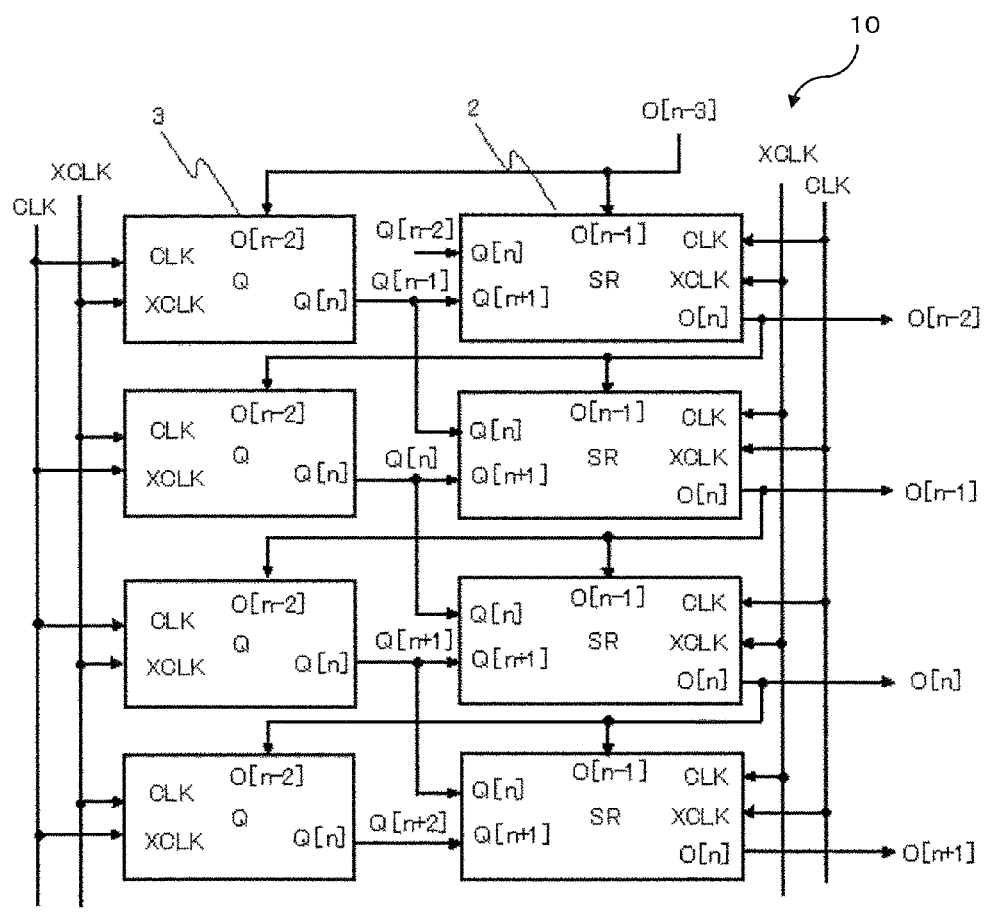
FIG. 11 is a circuit diagram of a gate driver of Embodiment 4.

Hereinafter, Embodiment 4 will be described with reference to FIG. 11. The present embodiment is a gate driver 10 in which a plurality of stages of the shift register circuits 1 of Embodiment 3 are connected to each other. The output O[n−2] of the shift register circuit 1 of an (n−2)-th stage (n is an integer of 3 or more) is used as an input of the shift register unit 2 and the gate control circuit 3 of an (n−1)-th stage. The output Q[n] of the gate control circuit 3 of an (n−1)-th stage is inputted to the shift register unit 2 of an (n−1)-th stage and the shift register unit 2 of an n-th stage, respectively. That is, the present embodiment is characterized in that, the output Q[n] of the gate control circuit 3 is shared by two continuous shift register units 2. By this configuration, a circuit scale of the gate driver may be reduced. The reason is that, although the shift register circuit 1 of one stage illustrated in FIG. 9 describes the two gate control circuits 3, the number of the gate control circuits 3 may be reduced by sharing the gate control circuit 3 between the plurality of continuous shift register circuits 1.

Embodiment 5

Hereinafter, Embodiment 5 will be described with reference to FIG. 12. The present embodiment is a gate control circuit in which a second output Q2[n] is added to the buffer unit 4 of the gate control circuit 3 illustrated in Embodiment 1. Hereinafter, an added part of the gate control circuit 3 illustrated in FIG. 12 will be described. The buffer unit 4 is added with at least a transistor M17 which connects the second output Q2[n] of the gate control circuit 3 and the first power supply VSS, a transistor M18 which connects the second output Q2[n] and the first output Q[n], and a transistor M19 which connects a gate terminal of the transistor M18 and an output O[n+2] of a shift register circuit of an (n+2)-th stage, wherein the gate terminal of the transistor M17 is controlled by the clock signal CLK.

The operation of the gate control circuit 3 illustrated in FIG. 12 will be described below based on an operation waveform illustrated in FIG. 13. In a period T0 in which the output O[n+2] of the shift register circuit of a second following stage becomes a high level, a gate and a drain of the transistor M19 become a high level, and therefore Q3 which is a source terminal rises to a potential lower by about a threshold voltage of the transistor M19 than the high level, such that the transistor M18 is in the conduction state. However, in the period T0, since the first output Q[n] is at a low level, the second output Q2[n] via the transistor M18 also becomes a low level.

Next, when the operation moves to the period T1 and the clock signal is inverted to change the CLK to a high level and the XCLK to a low level, respectively, the Q[n] and the Q2[n] are continued to be fixed to a low level of the first power supply VSS by the conduction of the transistors M13 and M17.

Next, when the operation moves to the period T2 and the clock signal is inverted to change the CLK to a low level and the XCLK to a high level, respectively, the output Q[n] rises to a high level of the clock signal XCLK. Thereby, the second output Q2[n] which is the source terminal of the transistor M18 maintained in the conduction state also rises to a high level. In this case, the level of the Q3 which is the gate terminal of the transistor M18 rises to a high level or more by the bootstrap effect, but the transistor M19 cannot hinder the rising thereof. The reason is that the source terminal of the transistor M19 is replaced by the output O[n+2] of the shift register of the next following stage and the drain terminal thereof is replaced by the Q3, and the gate terminal and the source terminal are at the same high level, such that the transistor M19 is in the non-conductor state.

Next, when the operation moves to the period T3 and the clock signal is inverted to change the CLK to a high level and the XCLK to a low level, respectively, the Q[n] and the Q2[n] are fixed to a low level of the first power supply VSS by the conduction of the transistors M13 and M17.

After the period T3, the output O[n+2] of the shift register circuit of the second following stage becomes a low level, and therefore the Q3 which is the gate terminal of the transistor M18 is fixed to a low level by the conduction of the transistor M19, and the transistor M18 is in the non-conduction state. Therefore, the second output Q2[n] is sequentially reset to a low level by the transistor M17 and the clock signal CLK without rising to a high level in synchronization with the first output Q[n].

The second output Q2[n] of the gate control circuit 3 illustrated in FIG. 12 may be used instead of the Q[n] in the gate of the transistor M1 of the shift register unit illustrated in FIG. 3. That is, as the gate signal for conducting the output transistor M1 so as to invert the output O[n] of the n-th shift register circuit to a low level, the Q2[n] is a sufficient signal.

Advantageously, the load of the clock signal may be reduced and the power consumption may be reduced by using the Q2[n] instead of the Q[n]. The output transistor for decreasing the potential of the gate line at a high speed is a transistor having a large channel size, and the gate capacity thereof is also large. Therefore, in order to charge and discharge the capacity load of the output transistor, large power is required. When the Q[n] is used for the gate control of the output transistor, the capacity load of the gate is charged and discharged in synchronization with the clock signal even a time other than when the potential of the gate line falls, that is, a time when the potential of the gate line is fixed to a low level. Therefore, the power is supplied from the clock signal through the gate control circuit 3, and the load of the clock signal is large.

Figure 13:
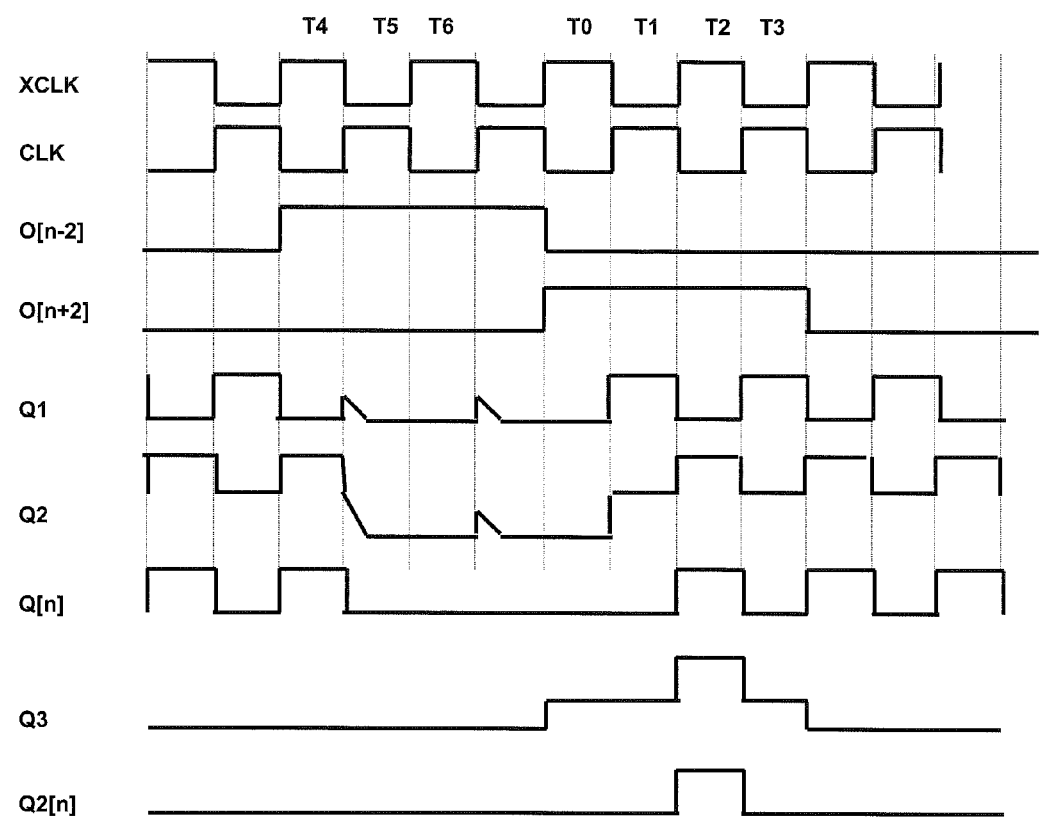
FIG. 13 is a timing chart illustrating an operation waveform of the gate control circuit of Embodiment 5.

Meanwhile, when the Q2[n] is used for the gate control of the output transistor having a large gate capacity load, the charging and discharging of the gate capacity load as illustrated in FIG. 13 is limited to the period T2 in which the potential of the gate line falls. Since the capacity load of the gate is not synchronized with the clock signal in the period other than the period T2, the power from the clock signal is not supplied without performing the charging and discharging of the gate capacity load. By reducing the frequency of charging and discharging of the large gate capacity load of the output transistor, it is possible to reduce the load of the clock signal and the power consumption.

Embodiment 6

Hereinafter, Embodiment 6 will be described with reference to FIG. 14. The present embodiment is different from Embodiment 3 in that an output transistor M5 which connects the output O[n] of the shift register circuit 1 and the first power supply VSS is added, and the gate control of the output transistors M1, M4 and M5 is performed by the gate control circuit of Embodiment 5 instead of the gate control circuit of Embodiment 1. The gate control of the output transistor M1 is performed by a second output Q2[n] of the first gate control circuit, the gate control of the output transistor M4 is performed by a first output Q[n+1] of the second gate control circuit, and the gate control of the output transistor M5 is performed by a first output Q[n] of the first gate control circuit.

Figure 15:
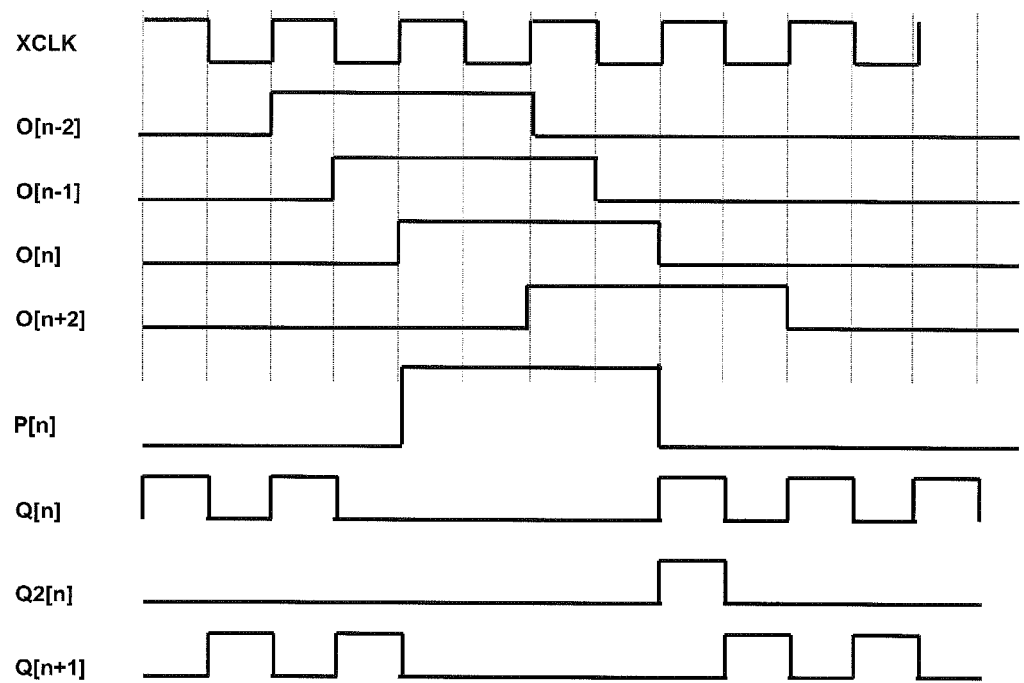
FIG. 15 is a timing chart illustrating an operation waveform of the shift register circuit of Embodiment 6.

An operation of the present embodiment will be described using an operation waveform illustrated in FIG. 15. The present embodiment is different from Embodiment 3 in that the output transistor M1 is gate-controlled by the second output Q2[n] of the first gate control circuit 3. The second output Q2[n] is synchronized with the first output Q[n] while the input signal O[n+2] is at a high level. That is, the Q2[n] is inverted to a high level only when the output O[n] of the shift register circuit falls from the high level to a low level. The output transistor M1 which is gate-controlled by the Q2[n] is conducted only when the output O[n] falls. Meanwhile, any one of the output transistors M4 and M5 which are gate-controlled by the first outputs Q[n] and Q[n+1] of the first and second gate control circuits 3 is conducted in the period in which the output O[n] does not output a high level, thereby fixing the output O[n] to a low level.

In connection with the channel size of the output transistor, the output transistor M1 needs a large channel width to decrease the potential of the gate line at a high speed, but the output transistors M4 and M5 have a purpose of fixing the potential of the gate line to a low level, and therefore the large channel width is not required.

Embodiment 7

Hereinafter, Embodiment 7 will be described with reference to FIG. 16. The present embodiment is a gate driver 10 in which a plurality of stages of the shift register circuits 1 of Embodiment 5 are connected. The output O[n−2] of the shift register circuit 1 of an (n−2)-th stage (n is an integer of 3 or more) is used as an input of the shift register unit 2 and the gate control circuit 3 of an (n−1)-th stage. The first output Q[n] of the gate control circuit 3 of the (n−1)-th stage is inputted to the shift register unit 2 of the (n−1)-th stage and the shift register unit 2 of the n-th stage, respectively. Further, the second output Q2[n] of the gate control circuit 3 of the (n−1)-th stage is inputted to the shift register unit 2 of the n-th stage. That is, the present embodiment is characterized in that, the output Q[n] of the gate control circuit 3 is shared by two continuous shift register units 2. By this configuration, the circuit scale of the gate driver may be reduced. The reason is that, although the shift register circuit 1 of one stage illustrated in FIG. 14 describes the two gate control circuits 3, the number of gate control circuits 3 may be reduced by sharing the gate control circuit 3 between the plurality of continuous shift register circuits 1.

Embodiment 8

Figure 17:
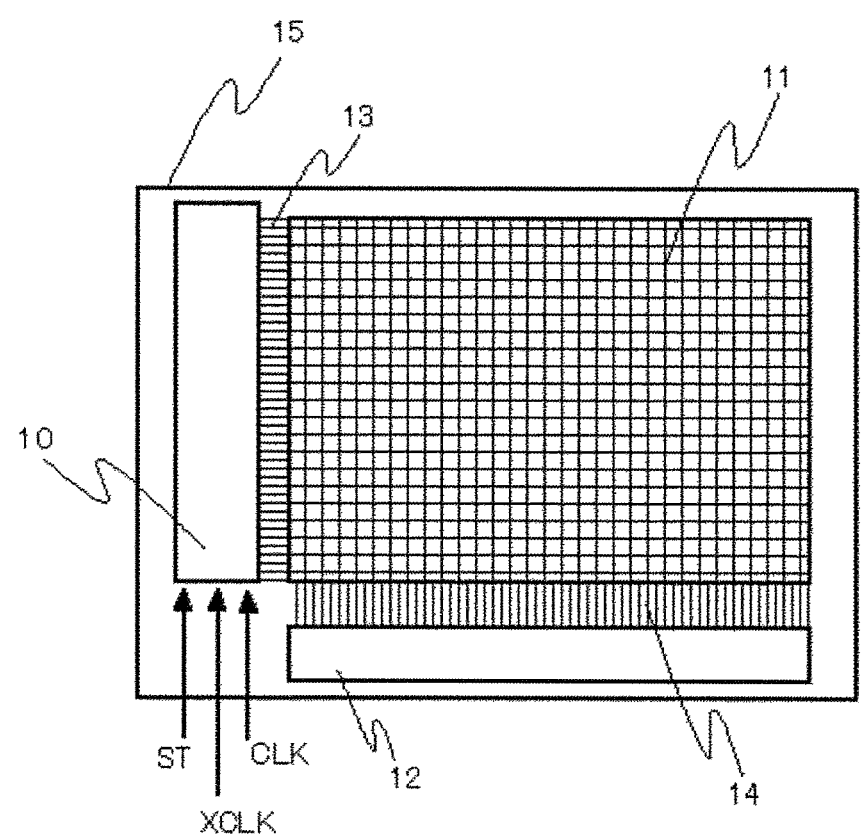
FIG. 17 is a view illustrating a matrix type display apparatus of Embodiment 8.

Hereinafter, Embodiment 8 will be described with reference to FIGS. 17 and 18. The present embodiment is a matrix type display apparatus 15 in which the gate driver 10 of Embodiment 4 or Embodiment 7 is mounted, and as illustrated in FIG. 17, a plurality of gate lines G1, G2, and . . . of a pixel array (a display unit) 11 including pixel elements which are disposed at portions in which a plurality of gate lines 13 and a plurality of data lines 14 intersect are connected to outputs O[1], O[2], and . . . of the above-described gate driver 10. Further, the gate driver 10 is inputted with the two-phase clock signals of the CLK and XCLK, and is inputted with a start signal ST as the input of the shift register circuit 1 of a first stage of the gate driver 10. The gate driver 10 is operated like a waveform as illustrated in FIG. 18, and performs overlap scanning having a period in which the plurality of continuous gate lines 13 are simultaneously selected (become a high level). A selection period of each gate line 13 is controlled by the pulse width of the start signal ST. Further, a time difference between the selection periods of the respective gate lines is controlled at a half period of the clock signals CLK and XCLK.

In the matrix type display apparatus of the present embodiment, since the clock signal having a high amplitude of the gate potential is small as two, it is possible to reduce the number of level shift circuits generating a high amplitude signal, and suppress member costs. Further, it is possible to reduce a wiring layout area of the clock signal line, and achieve a display apparatus with a narrow frame.

Further, the present invention is not limited to the above-described embodiments, but may be appropriately changed without departing from the scope of the present invention. For example, the transistors illustrated in the above-described embodiments are limited to the N-type, but the transistors may be substituted into a P-type transistor, and as each transistor, a polycrystalline silicon transistor, an amorphous silicon transistor, or transistors formed of an oxide semiconductor or an organic semiconductor other than silicon may be used.

In the above-described shift transistor circuit, output pulse widths of each shift register are not determined by the pulse widths of the clock signal but are determined by the input pulse widths, for example, the output pulse widths of the shift register circuit of the preceding stage. Therefore, when the gate driver is formed by connecting a plurality of stages of the shift register circuits, even in the overlapping scanning, the clock signal may be two phases.

According to the above-described embodiments, a fast and low power-consumption gate driver may be achieved. The reason is that the gate control of the output transistor for decreasing the potential of the gate line at a high speed is performed by the clock driven bootstrap circuit which is the buffer unit, and therefore the driving of the large load may be made at a high speed while avoiding power consumption such as the through current. Further, the area of the gate control circuit may be saved. The reason is that the bootstrap circuit is provided as the buffer unit, and therefore the transistor size or the capacitor size of the timing generation unit included in the gate control circuit may be decreased. Further, by using the clock signal for driving the bootstrap circuit as an external input signal, a high speed operation may be achieved.

Further, according to the above-described embodiments, in the gate control circuit, the timing margin of the timing generation unit may be expanded and the demand for the high-speed operation may be alleviated. The reason is that, to transmit the signal of the timing generation unit, the timing margin of the clock half period is given and the output rising time of the timing generation unit is not directly reflected to the output falling time of the shift register circuit.

Further, according to the above-described embodiments, it is possible to suppress the reduction in reliability due to a threshold shift of the transistor. The reason is that the gate terminal of the output transistor is applied with the voltage synchronized with the two-phase clock signal by the gate control circuit to alleviate the threshold shift while avoiding a long-term conduction state of the output transistor.

Further, according to the above-described embodiments, it is possible to suppress the load of the clock signal and the power consumption. The reason is that the inversion of the output $Q2[n]$ of the gate control circuit is limited to 1 time per 1 frame in which one gate line is driven. That is, the charging and discharging frequency of the gate load capacity of the output transistor M1 of which the gate terminal is controlled by the $Q2[n]$ is limited, and the load and the power consumption of the clock signal performing the charging and discharging is suppressed.

In the matrix type display apparatus in which the gate driver is mounted, it is possible to achieve the display apparatus with a narrow frame. The reason is that the area of the timing generation unit which is a component of the gate driver disposed around the display screen may be saved, and the clock signal line for driving the gate driver may be two to reduce the area of the wiring layout.

In the above-described matrix type display apparatus, since the clock signal having the high amplitude of the gate potential is small as two, it is possible to reduce the number of the level shift circuits generating the high amplitude signal and suppress the member costs.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. A shift register circuit including a single conductivity type transistor, comprising:
   a shift register unit having a first output transistor which connects an output terminal and a first power supply; and
   a first gate control circuit of which an output terminal is connected to a gate terminal of the first output transistor,
   wherein the first gate control circuit includes a timing generation unit and a buffer unit,
   wherein the buffer unit is a bootstrap circuit,
   wherein an output of the timing generation unit to which an input signal is inputted is used as an input of the buffer unit and an output of the buffer unit is used as an output of the first gate control circuit, and
   wherein the buffer unit is a bootstrap circuit including at least:
      a second transistor which connects the output of the buffer unit and a first clock signal;
      a third transistor which connects a gate terminal of the second transistor and an output of the timing generation unit and is gate-controlled by a second clock signal; and
      a fourth transistor which connects the output of the buffer unit and the first power supply and is gate-controlled by the second clock signal.

2. The shift register circuit of claim 1, wherein the timing generation unit includes:
   a fifth transistor which is gate-controlled by an input of the first gate control circuit and connects the first power supply and an input of the buffer unit; and
   a first capacitor which connects the input of the buffer unit and the second clock signal.

3. The shift register circuit of claim 1, wherein the timing generation unit includes:
   a sixth transistor which is gate-controlled by an input of the first gate control circuit and connects the first power supply and an input of the buffer unit; and
   a seventh transistor which connects the input of the buffer unit and a second power supply and has a gate terminal connected to the second power supply.

4. The shift register circuit of claim 1, wherein the shift register unit includes:
   an eighth output transistor having a source terminal connected to an output terminal of the shift register circuit and a drain terminal connected to a second power supply; and
   a ninth transistor having a gate terminal to which the first clock signal is inputted, a drain terminal to which an additional input signal is inputted, and a source terminal connected to a gate terminal of the eighth output transistor.

5. The shift register circuit of claim 1,
   wherein the shift register unit includes a tenth output transistor which connects the output terminal of the shift register circuit and the first power supply,
   further comprising a second gate control circuit of which an output terminal is connected to a gate terminal of the tenth output transistor, and
   wherein the second gate control circuit includes a timing generation unit and a buffer unit, and
   wherein an output of the timing generation unit included in the second gate control circuit to which an input signal is inputted is used as an input of the buffer unit included in the second gate control circuit and an output of the buffer unit included in the second gate control circuit is used as an output of the second gate control circuit.

6. The shift register circuit of claim 1,
   wherein the shift register unit includes a tenth output transistor which connects the output terminal of the shift register circuit and the first power supply,
   further comprising a second gate control circuit of which an output terminal is connected to a gate terminal of the tenth output transistor, and
   wherein the second gate control circuit includes a timing generation unit and a buffer unit, and
   wherein an output of the timing generation unit included in the second gate control circuit to which an input signal is inputted is used as an input of the buffer unit included in the second gate control circuit and an output of the buffer unit included in the second gate control circuit is used as an output of the second gate control circuit.

7. The shift register circuit of claim 6, wherein
the buffer unit included in the first gate control circuit is a bootstrap circuit configured to output the first clock signal, and the buffer unit included in the second gate control circuit is a bootstrap circuit configured to output the second clock signal.

8. A gate driver in which a plurality of stages of the shift register circuits of claim 5 are connected, wherein
an output of the shift register circuit of an (n−2)-th (n is an integer of 3 or more) stage is used as an input of the shift register unit and the first or second gate control circuit of an (n−1)-th stage, and
an output of the first or second gate control circuit of the (n−1)-th stage is used as an input of the shift register unit of the (n−1)-th stage and the shift register unit of the n-th stage.

9. The shift register circuit of claim 1, wherein
the shift register circuit is a shift register circuit of an n-th (n is an integer of 3 or more) stage of a gate driver, and
the buffer unit of the first gate control circuit is a bootstrap circuit, which has at least a second output, and includes: an eleventh transistor which connects the second output of the buffer unit and the first power supply; a twelfth transistor which connects the second output of the buffer unit and the output of the buffer unit; and a thirteenth transistor which connects a gate terminal of the twelfth transistor and an output of the shift register circuit of an (n+2)-th stage, and in which the eleventh transistor is controlled by the second clock signal, and the thirteenth transistor is controlled by a second power supply.

10. A shift register circuit, comprising:
the first gate control circuit of claim 9 of which the second output is connected to the gate terminal of the first output transistor.

11. A gate driver in which a plurality of stages of the shift register circuits of claim 9 are connected, wherein
an output of the shift register circuit of an (n−2)-th stage is used as an input of the shift register unit and the first gate control circuit of an (n−1)-th stage,
an output of the shift register circuit of an (n+2)-th stage is used as an input of the first gate control circuit of the (n−1)-th stage,
a first output of the first gate control circuit of the (n−1)-th stage is used as an input of the shift register unit of the (n−1)-th stage and the shift register unit of the n-th stage, and
a second output of the first gate control circuit of the (n−1)-th stage is used as an input of the shift register unit of the n-th stage.

12. A matrix type display apparatus in which the gate driver of claim 8 is mounted, comprising:
a display unit having pixel elements disposed at portions in which a plurality of gate lines and a plurality of data lines intersect,
wherein an output of the gate driver is connected to the gate line,
wherein overlap scanning having a period in which the plurality of gate lines are simultaneously selected is performed, and
wherein the selection period of the gate line is controlled by a pulse width of a start signal.

13. A matrix type display apparatus in which the gate driver of claim 11 is mounted, comprising:
a display unit having pixel elements disposed at portions in which a plurality of gate lines and a plurality of data lines intersect,
wherein an output of the gate driver is connected to the gate line,
wherein overlap scanning having a period in which the plurality of gate lines are simultaneously selected is performed, and
wherein the selection period of the gate line is controlled by a pulse width of a start signal.

14. A shift register circuit including a single conductivity type transistor, comprising:
a shift register unit having a first output transistor which connects an output terminal and a first power supply; and
a first gate control circuit of which an output terminal is connected to a gate terminal of the first output transistor,
wherein the first gate control circuit includes a timing generation unit and a buffer unit,
wherein the buffer unit is a bootstrap circuit,
wherein an output of the timing generation unit to which an input signal is inputted is used as an input of the buffer unit and an output of the buffer unit is used as an output of the first gate control circuit, and
wherein the buffer unit is a bootstrap circuit including at least:
a second transistor and a twelfth transistor which connect an output of the buffer unit and a first clock signal in series; and
a third transistor which connects a gate terminal of the second transistor and an output of the timing generation unit, and
a thirteenth transistor which connects a gate terminal of the twelfth transistor and an output of the shift register circuit of an (n+2)-th stage.

* * * * *